United States Patent
Dakshina-Murthy et al.

(10) Patent No.: US 6,900,139 B1
(45) Date of Patent: May 31, 2005

(54) METHOD FOR PHOTORESIST TRIM ENDPOINT DETECTION

(75) Inventors: Srikanteswara Dakshina-Murthy, Austin, TX (US); Douglas J. Bonser, Austin, TX (US); Karen Turnquest, Pflugerville, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 251 days.

(21) Appl. No.: 10/135,175

(22) Filed: Apr. 30, 2002

(51) Int. Cl.⁷ ............................................. H01L 21/4763
(52) U.S. Cl. ..................... 438/725; 438/706; 438/710; 438/735; 438/736
(58) Field of Search ................................ 438/694, 699, 438/706–712, 717, 725, 726–728, 734, 735–737

(56) References Cited

U.S. PATENT DOCUMENTS

| | | | | |
|---|---|---|---|---|
| 5,902,133 A | * | 5/1999 | Linliu | .......................... 438/717 |
| 5,962,195 A | * | 10/1999 | Yen et al. | .................... 430/316 |
| 5,980,768 A | * | 11/1999 | Abraham | ...................... 216/67 |
| 6,162,577 A | * | 12/2000 | Felter et al. | ............. 430/270.1 |
| 6,340,603 B1 | * | 1/2002 | Bell | .............................. 438/9 |
| 2002/0072225 A1 | * | 6/2002 | Laaksonen et al. | ......... 438/636 |
| 2003/0049876 A1 | * | 3/2003 | Mori et al. | .................... 438/23 |
| 2003/0092281 A1 | * | 5/2003 | Ramachandramurthy et al. | .......................... 438/725 |

* cited by examiner

Primary Examiner—Craig A. Thompson
Assistant Examiner—Thanhha Pham
(74) Attorney, Agent, or Firm—Toler, Larson & Abel, LLP

(57) ABSTRACT

A method for forming semiconductor features, e.g., gates, line widths, thicknesses and spaces, produced by a photoresist trim procedure, in a closed loop process is presented. The methodology enables the use of optical emission spectroscopy and/or optical interferometry techniques for endpoint monitoring during resist trim etching of photoresist structures. Various types of material layers underlying photoresist structures are employed in order to provide an endpoint signal to enable closed loop control, with resultant improved targeting of photoresist mask and reproducibility. In addition, the method provides for in situ etch rate monitoring, and is not adversely affected by etch rate variances within an etching chamber during an etch process.

29 Claims, 5 Drawing Sheets

METHOD FOR PHOTORESIST TRIM ENDPOINT DETECTION

FIELD OF THE DISCLOSURE

The present invention relates generally to semiconductor manufacturing, and more particularly to a process of trimming photoresist material on semiconductor wafers.

BACKGROUND

In semiconductor wafer fabrication, the component features of the integrated circuits (ICs) are defined on the wafer using well known patterning and etching techniques. Traditionally, a layer of photoresist material is deposited onto a wafer. The wafer typically has a substrate layer or layers, and various overlying intermediate layers formed of either conductive materials or dielectric materials, depending upon the type of device being fabricated. The photoresist material is then patterned by photolithography techniques, e.g., exposing the photoresist to electromagnetic radiation (light) filtered by a reticle. After passing through the reticle, the light impinges upon the surface of the photoresist material. The light alters the chemical composition of the photoresist material such that a developer can be used to remove either the exposed regions, or the unexposed regions, depending upon whether positive or negative photoresist materials were employed. Positive photoresist is predominantly used in current generation sub-micron feature fabrication. With positive photoresist materials, the light alters the structure and chemical properties of the photoresist, and converts exposed regions to base-soluble polymer fragments through the photogeneration of acid species. These base-soluble sections are removed using a solvent in a development process, which leaves a number of photoresist lines remaining. Then the wafer is etched to remove the material from areas not protected by the photoresist material, thus defining the desired features of the wafer.

As the density of integrated circuits (ICs) increases, feature sizes of the lines and components in the ICs correspondingly decreases. Even with the numerous enhancements of photolithography systems to realize these decreasing feature sizes, current lithographic systems cannot define features much under about 0.13 microns. This limitation is due to several factors such as reticle/mask pattern fidelity, optical proximity effects, and diffusion and loading effects during resist and etch processing. Various techniques have been devised in attempts to reduce feature sizes within the framework of current lithographic systems. One such technique, called photoresist trimming, utilizes dry plasma etching as a method for further reducing the critical dimension (CD) of features, e.g., gates, via resist etching by neutral and ion species generated in the plasma.

There are various types of dry plasma reactors known in the art of advanced wafer fabrication, for example, downstream etch systems, decoupled plasma source (DPS), reactive ion etch (RIE), electron-cyclotron resonance (ECR), inductively-coupled plasma (ICP), and magnetically enhanced RIE (MERIE), to name a few. The principal dry etch applications are etching of dielectric, etching of silicon, and etching of metal. Generally, well controlled etch profile and CD uniformity are achieved with these various plasma systems. The primary disadvantage to these dry etch processes is their poor selectivity to the underlying layer, which requires frequent monitoring during etch to minimize over-etching into the underlying layers.

Current resist trimming techniques to generate features of smaller CD than can be achieved through photolithographic techniques alone achieve the target CD by trimming for an interval of time based on the lateral resist trim rate, which results in an open-loop control (endpoint detection is not possible). In this conventional approach, resist is trimmed laterally, and vertically, for a required time interval, $t_{TRIM}$, based upon an empirically derived horizontal trim rate $R_H$, typically in nm per second (nm/s). However, if etch chamber conditions change, as they are prone to do, the empirically derived trim rate may change such that the etch rate increases or decreases during the required etch time interval, resulting in under-etch or over-etch of the CD.

Optical emission spectroscopy (OES), which is based upon changes in the spectrum of radiation emitted by the plasma during etch, is one commonly used monitoring technique in dry etching processes. While OES can help detect the onset of complete removal of the current etched layer in a stack, OES cannot supply information about etch rate or relative thickness, nor can it be applied for endpoint detection in resist trim processes if the material layer underlying the feature undergoing etch interacts continuously with the plasma (is not etched away) during the etch process. This is because there is no change in species during the process for the OES to detect to determine an endpoint, and thus an open-loop (time dependent) control process is required to achieve the proper CD of the desired feature. This concept is illustrated in FIGS. 1 and 2.

FIG. 1 shows a cross-sectional view of a portion of a semiconductor device 100 about to undergo a resist trim (dry etch process) to alter the CD of the desired defining feature. The semiconductor device portion 100 has already been subjected to photo patterning as previously discussed, with the defining feature 14 in the example being a photoresist mask structure used to pattern a subsequent feature, such as a gate. Semiconductor device portion 100 consists of a substrate 9, formed of, e.g., silicon, a first layer 10 formed of, e.g., poly silicon, formed over substrate 9, and a dielectric ARC (anti-reflective layer) layer 12, formed of, e.g., silicon nitride, formed over poly silicon layer 10, and a photoresist defining feature 14 having an initial width 5. For simplicity of illustration, semiconductor device portion 100 is shown comprising only three layers, but as is well known in the art, more layers may be provided.

FIG. 2 shows a prior art result of resist trimming on semiconductor device portion 100 after completion of resist trimming. During trim, the dielectric ARC layer 12 interacts continuously with the plasma, however dielectric ARC layer 12 is not etched away at a significant rate. Thus dielectric ARC layer 12 is unchanged in vertical dimension (thickness), and there is no new species generated for OES endpoint detection. Defining feature 14 has been trimmed laterally (and vertically) during the process, based upon an empirically determined lateral trim rate for the plasma chamber RH, typically in units of nm/sec, according to the following formula:

$$W_{FINAL} = W_{INITIAL} - R_H \times t_{TRIM}$$

Where $W_{FINAL}$ is the final width 7 of the critical dimension of defining feature 14, $W_{INITIAL}$ is the initial width 5 of the defining feature 14, $R_H$ is the lateral trim rate, and $t_{TRIM}$ is the amount of time required for trimming to achieve the CD final width 7. Depending upon chamber conditions during a resist trim process, final width 7 of defining feature 14 may or may not be the desired CD, as previously discussed, necessitating an open loop control.

Optical interferometry (broadband or laser source) is an additional monitoring technique used with dry etching tools. Optical interferometry is based upon detection of the optical characteristics of a broadband or laser source reflected from the etched surface. Unlike OES, interferometry provides both etch rate and thickness, but is more sensitive to the optical and geometrical properties of the material. Optical interferometry may be successfully used, for example, in the monitoring of poly silicon etching of the gate stack. As the poly silicon is etched away, the stack becomes more transparent and the resultant interference between patterned and open areas results in interference fringes of increasing amplitude. It is straightforward in this case to determine the extent of poly silicon remaining and determine endpoint. However, when optical interferometry is used during resist trim, the thickness of the etched resist does not change as significantly, and a large dependency exists on the exact pattern density of the location being monitored. Hence, optical interferometry monitoring techniques are not generally suitable for resist trim endpoint monitoring on a conventional stack.

Therefore, what is needed is a reliable method for photoresist endpoint detection that maintains a consistent critical dimension and provides for a closed loop process.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Other advantages, features and characteristics of the present invention, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

FIGS. 3–9 illustrate a method for controlling structure dimensions, i.e., critical dimension (CD) in structures such as gates, line widths, thicknesses and spaces, produced by a photoresist trim procedure, in a closed loop process. The methodology enables the use of optical emission spectroscopy and/or optical interferometry techniques for endpoint monitoring during resist trim etching of CD structures. In the various embodiments, various types of tracer material layers underlying CD structures are employed in order to provide an endpoint signal to enable closed loop control, with resultant improved targeting of CD and reproducibility. In addition, the method provides for in situ etch rate monitoring, and is not adversely affected by etch rate variances within an etching chamber during an etch process. In the following description, numerous specific details are set forth to provide a thorough description of the invention. However, it will be apparent to one skilled in the art that the disclosure may be practiced without these specific details, or with other specific details. In other instances, well-known features have not been described in detail so as not to obscure the invention. Those skilled in the art will appreciate that the methods of the disclosure are not limited to the exemplary structure shown, but instead may be used to facilitate formation of critical dimension features by removal of photoresist material in any semiconductor device. The terms "etch rate" and "trim rate" are applied synonymously throughout this document. In terms of the art, to "etch" something is essentially the same as to "trim" something, as trimming is an etch process.

It will be appreciated that although the various embodiments discuss application of the methodology taught herein with reference to critical dimension structures, the teachings could be applied to non-critical dimension features as well.

Figure 1:
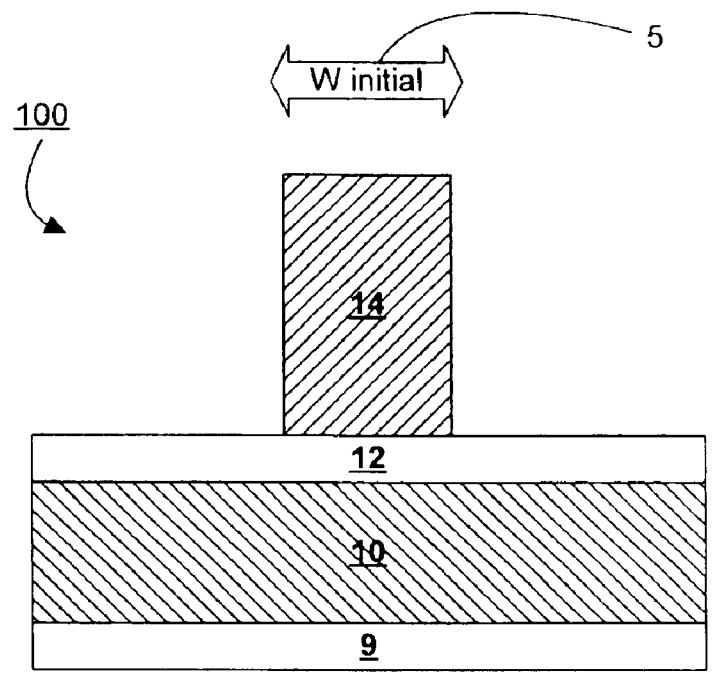
FIG. 1 illustrates a cross-sectional view of portion of a semiconductor device of the prior art.
Figure 2:
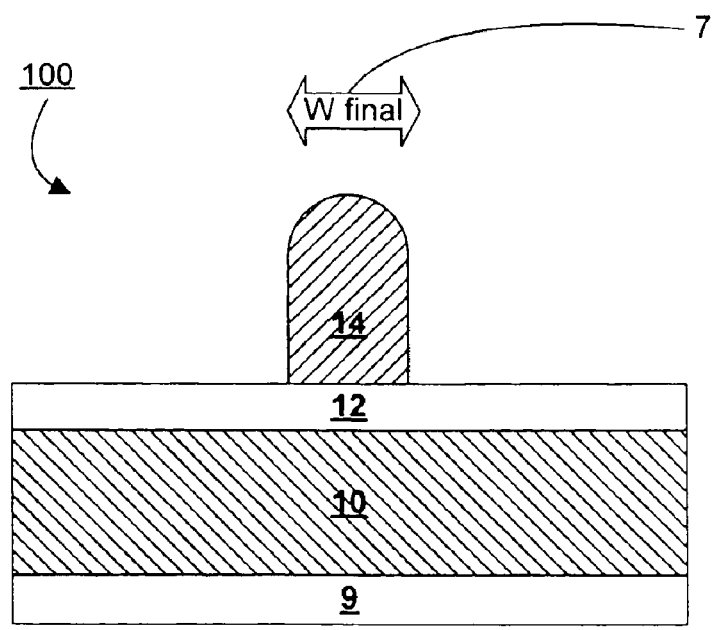
FIG. 2 illustrates a cross-sectional view of a prior art result of resist trimming on a portion of a semiconductor device after completion of resist trimming.
Figure 3:
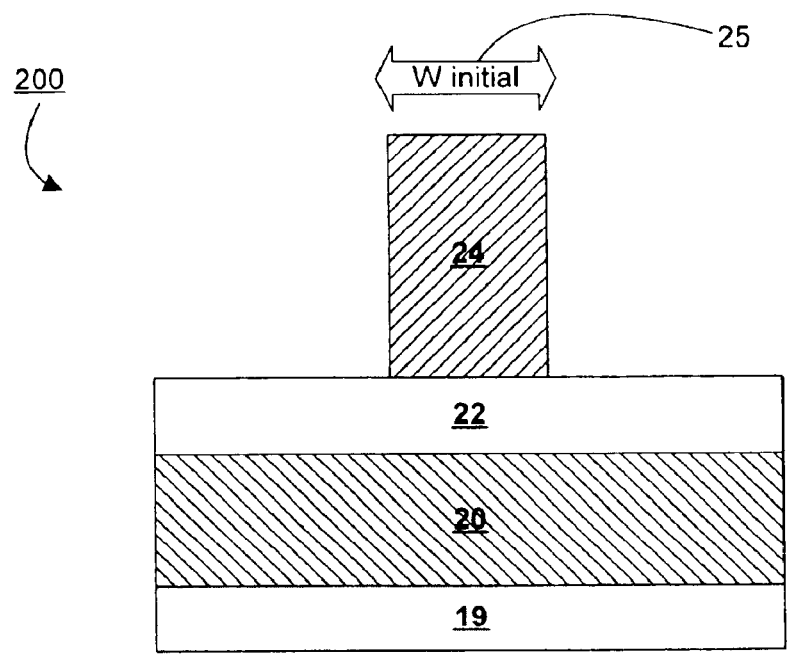
FIG. 3 illustrates a cross-sectional view of a portion of a semiconductor device prior to the process of photoresist trimming according to at least one embodiment of the present invention.

Referring to FIG. 3, a cross-sectional view of a portion of a semiconductor device 200 prior to the process of photoresist trimming according to an embodiment of the present disclosure, is presented. The portion of semiconductor device 200 has already been subjected to photo patterning, with the defining feature in the example being a feature to define the width of a structure such as a gate. The portion of semiconductor device 200 consists of a substrate 19, a first layer 20 formed over substrate 19, a second layer 22 formed over the first layer 20, and a photoresist mask feature 24. Photoresist mask feature 24 has an initial lateral dimension (width) $W_{INITIAL}$ 25.

In an embodiment, substrate 19 may be silicon, or other composition, e.g., silicon on insulator, or other materials suitable to the purpose of the device being manufactured.

In a specific implementation, first layer 20 comprises a layer that will eventually be utilized in photo patterning. First layer 20 may be a dielectric material or a conductive material, depending upon the type of device being fabricated. Examples of dielectric materials suitable for use in layer 20 are silicon nitride (SiN(x)), silicon oxynitride (SiON, SiO(x)N(y)), or silicon dioxide (SiO2). Layer 20 may also comprise conductive materials such as salicides or metallic compounds, e.g., materials containing conductive metal such as aluminum, copper, tungsten, etc. In a specific implementation, first layer 20 may be poly silicon. In other embodiments, layer 20 may comprise a film stack of multiple layers, e.g., a poly stack, with an inorganic ARC, or a BARC layer. Layer 20 has a thickness ranging from 100–200 nm.

In a specific implementation, layer 22 is a trimmable, organic bottom anti-reflective coating (BARC) layer, and serves as a tracer layer during subsequent photoresist trim processing. Examples of trimmable, organic BARC materials are formulations such as Shipley AR19 or AR20. Since the trimmable organic BARC layer 22 has to function as an antireflective coating, it is effective only at thicknesses close to certain nodes as defined by the wavelength, resist, underlying stack, and the like. An appropriate thickness for layer 22 can be determined from the teachings disclosed herein of the trim parameters discussed in subsequent paragraphs.

The portion of device 200 in FIG. 3 is subjected to a photoresist trimming process such as reactive ion etching (RIE), MERIE, ICP, or other suitable isotropic dry etch process. Typical trim processes run at cathode temperatures of 45–55 degrees C., with pressures ranging from 3–10 mTorr. Trim chemistries consist of $O_2$, HBr, $Cl_2$ and/or Ar, with a total flow on the order of 100–200 sccm, and plasma source powers ranging from 400 to 700 W. The range of molecular weight percentages for the trim process gases are as follows: between 10%–30% $O_2$; between 30%–50% HBr; and between 10%–30% $Cl_2$. Argon is generally used as a diluents gas. The main species attacking the resist are O neutrals, although H, Br and Cl radicals also play a passivating and/or catalytic role as appropriate. Ion bombardment from $O_2+$, Br+, $Cl^+$, or other ionic species also contribute to resist attack.

During the trim process, resist from the photoresist mask structure 24 is eroded laterally (horizontally) at a rate $R_H$, and trimmable organic layer 22 of thickness $B_{HEIGHT}$ is simultaneously eroded vertically at a rate $B_V$. A ratio of $R_H/B_V$ is determined according to the trim process selected for etching. For example, typical ranges of the ratio of $R_H/B_V$ are on the order of 1:1–1:4 for DPS/ICP etching systems, and 1:2–1:8 for RIE/MERIE etching systems. The time, $t_{BARC}$, required to erode all of trimmable organic layer 22 is determined with the following calculation:

$$B_{HEIGHT}=B_V \times t_{BARC}.$$

When all of trimmable organic layer 22 is eroded away at time $t_{BARC}$, the resist of photoresist mask structure 24 is laterally trimmed to the extent given by:

$$\text{Resist lateral trim}=R_H \times t_{BARC}$$

The desired dimension of the final width as compared to the initial width determines the lateral extent of trim required, $R_H \times t_{TRIM}$, and therefore $t_{TRIM}$. The BARC thickness etched away ($B_{LOSS}$) during this trim time is thus:

$$B_{LOSS}=B_V \times t_{TRIM}.$$

Figure 4:
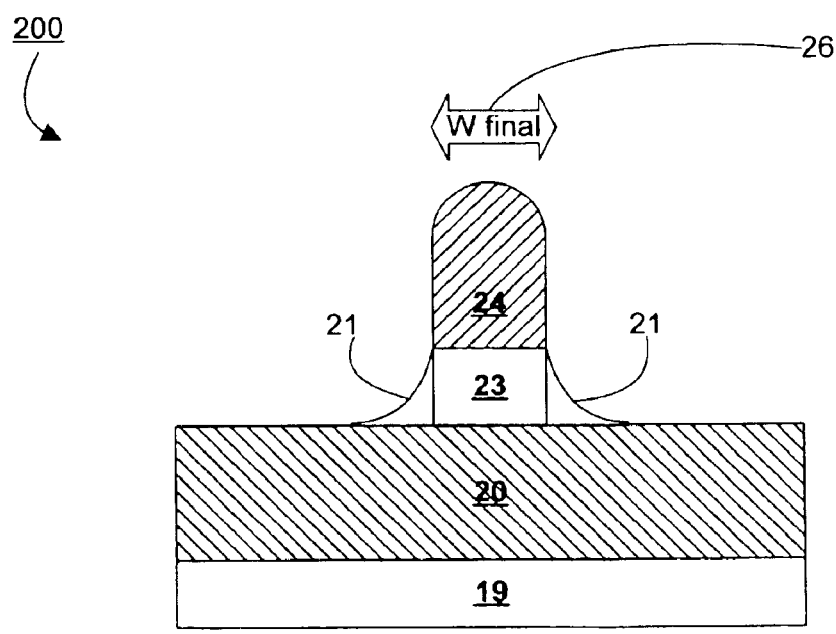
FIG. 4 illustrates the portion of the semiconductor device of FIG. 3 after the process of photoresist trimming according to at least one embodiment of the present invention.

This would result in the desired final CD lateral dimension 26 of photo resist mask feature 24, as seen in FIG. 4. FIG. 4 shows the portion of the semiconductor device of FIG. 3 after the process of photoresist trimming. It will be appreciated that the BARC thickness is also determined by the node appropriate for attaining an anti-reflective condition for photo patterning, as previously discussed. Hence, a BARC thickness at a node must be chosen such that $B_{HEIGHT}$ is less than or equal to $B_{LOSS}$, to insure that BARC is cleared at a trim time close enough to the required target for benefit of endpoint detection in etch process control. When this BARC thickness at a node has been chosen appropriately, the actual trim time $t_{TRIM}$ may be slightly larger than $t_{BARC}$. Thus, sufficient over-etch times or percentage can be used if desired $t_{TRIM}$ does not correspond exactly to $t_{BARC}$. For example, if one chooses a node that has a thickness 10% less than a desired thickness, then a 10% increase in the time $t_{TRIM}$ would result in $t_{TRIM}$ corresponding to $t_{BARC}$ at the conclusion of the 10% increase in etch time.

A remaining portion 23 of trimmable organic layer 22 is left directly below CD photoresist mask feature 24. Should residual features 21, or "feet" at the bottom of the former organic layer 22 occur, they may be removed in an anisotropic plasma breakthrough step, which would result in a good perpendicular profile between substrate 20 and photoresist mask structure 24, with the lateral dimension being the width W final 26. The plasma breakthrough process is typically used to remove traces of native oxide from the poly silicon layer prior to etching with the main poly etch chemistry. The breakthrough process is well-known in the art, and is generally a CF4/Ar type process run at sufficiently high bias power such that ion bombardment occurs, which promotes anisotropy of the etch front into the poly silicon.

The removal of the trimmable organic layer 22 permits the underlying material of layer 20 to interact with the plasma during subsequent etch processes. Detection of constituent species of layer 20 by OES during plasma etch (after removal of tracer layer 22) permits closed loop control. In addition, because the BARC tracer layer 22 is completely removed in open areas, the optical reflectivity of the remaining film stack (layers) changes significantly, which enables detection of endpoint via interferometric techniques. Depending upon the process application requirements, the present invention thus provides the process engineer the advantage of being able to use both techniques, OES and optical interferometry, simultaneously or independently to determine etch endpoints in sub-micron CD features.

Figure 5:
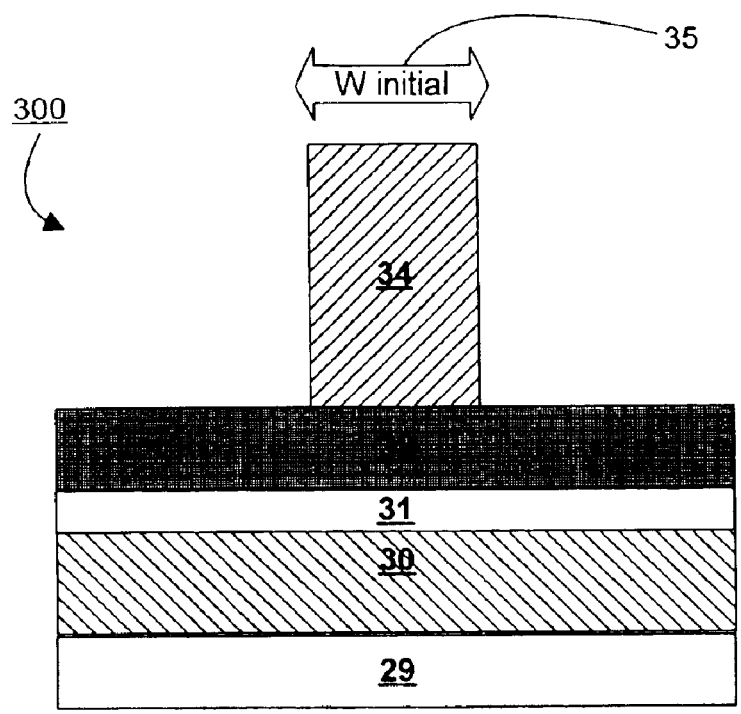
FIG. 5 illustrates a cross-sectional view of a portion of a semiconductor device prior to the process of photoresist trimming according to at least one embodiment of the present invention.

In one embodiment, detection of a trim endpoint is accomplished via use of an underlying (trimmable) Resist-Like Material (RLM) layer, as seen in FIG. 5. FIG. 5 illustrates a portion of a semiconductor device 300 prior to the process of photoresist trimming according to an embodiment of the present invention. The portion of semiconductor device 300 consists of a substrate 29, and a first layer 30 formed over substrate 29, a second layer 31 formed over layer 30, a third layer 32, formed over layer 31, and photoresist mask structure 34. Photoresist mask feature 34 has an initial lateral dimension (width) $W_{INITIAL}$ 25.

In an embodiment, substrate 29 may be silicon, or other composition, e.g., silicon on insulator, or other materials suitable to the purpose of the device being manufactured. In a specific implementation, first layer 30 may be poly silicon. In other embodiments, first layer 30 may be silicon, an inorganic ARC, a BARC, a dielectric material, a conductive material, or other materials, depending upon the device being fabricated. It should be noted that although layer 30 is shown as a single layer for simplicity of illustration, layer 30 may comprise a film stack of multiple layers, e.g., a poly stack, or other well-known materials. The thickness of layer 30 is ultimately determined by the device requirement, e.g., line resistivity. In the case when layer 30 is poly silicon, the thickness of layer 30 ranges from 100–200 nm.

In a specific implementation, layer 31 is an inorganic BARC layer 31. Examples of inorganic BARC materials are silicon nitride or silicon oxynitride, or other well-known materials of the art. The thickness of the inorganic BARC layer is determined by the thickness required to achieve an anti-reflective node, depending on the wavelength, total resist stack thickness, and underlying layer thicknesses.

In a specific embodiment, layer 32 is a trimmable, Resist-Like Material (RLM) composed of the essentially the same material as the bulk resist of photoresist mask structure 34, but RLM layer 32 is not an optically active layer. Layer 32 will serve as a tracer layer during subsequent processing. Typical 248 nm/193 nm photo resists used today are "chemically amplified." That is, these photoresists consist of a resist "backbone" polymer with some amount of Photo Acid Generator (PAG). The PAG releases acid upon illumination at the appropriate wavelength. Under post exposure heat treatment, the acid converts the polymer backbone chain in the exposed region to a base soluble form through a self-catalyzed process. This material is then removed by the slightly basic solvent used in the develop step. The RLM layer 32 as embodied by the present disclosure would consist of only the resist "backbone," without any PAG component. Hence, the RLM layer 32 would not be removed after the develop step, and would continue to serve as an underlayer to the resist pattern. Typical resist backbones are materials such as poly-hydroxy styrene (PHS), or cyclo-olefin maleic anhydride (COMA). Since the etch properties of the resist are determined by the backbone and not the trace amounts of PAG component, the RLM would behave like the actual "bulk resist" in the trim process. The thickness of RLM layer 32, $M_{HEIGHT}$, may be determined from the trim parameters as described in the subsequent paragraph.

The use of RLM layer 32 as a tracer layer instead of an organic BARC layer as previously disclosed results in enhanced flexibility of choice of the underlying material thickness. For example, the thickness of RLM layer 32 may be changed more easily to enable CD targeting, because the optical properties of RLM layer 32 are more similar to resist than is the case with organic BARC materials. When using organic BARC as the underlayer below the resist, as previously discussed, the BARC thickness is determined by the requirement of obtaining an anti-reflective node for the photo patterning in order to minimize standing wave patterns, eliminate reflective notching, or reduce CD dependence on topography. It may be difficult to obtain a starting BARC thickness ($B_{HEIGHT}$) that closely matches the BARC loss ($B_{LOSS}$) in the trim step. However, when using RLM as taught herein, the antireflective node properties are set by the underlying inorganic ARC, based on the "total" resist stack height, i.e., optically active resist layer 34 thickness, plus RLM layer 32 thickness. Hence, the RLM 32 and optically active resist layer 34 may be varied more independently to better match the total vertical loss during the trim step to the actual starting thickness.

Figure 6:
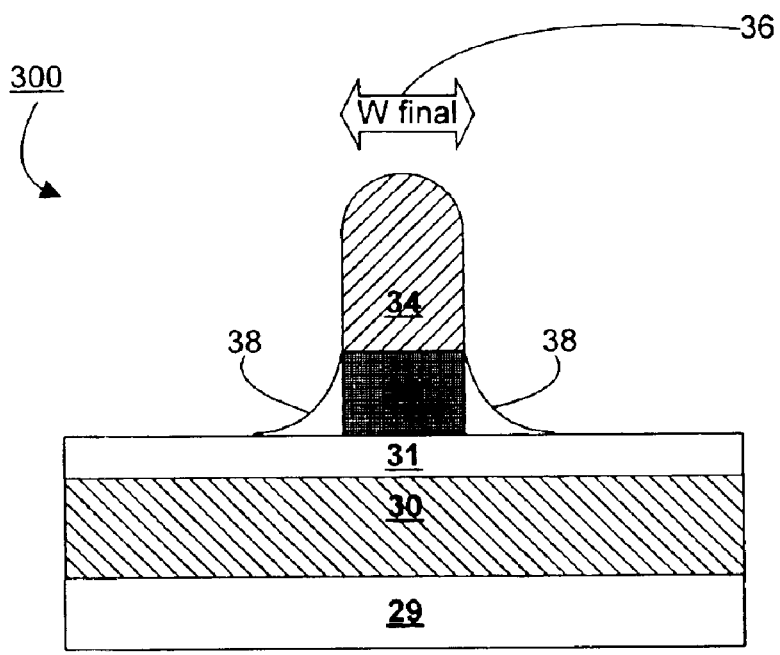
FIG. 6 illustrates the portion of the semiconductor device of FIG. 5 after the process of photoresist trimming according to at least one embodiment of the present invention.

FIG. 6 illustrates the portion of the semiconductor device of FIG. 5 after the process of photoresist trimming according to an embodiment of the present invention. Again, the principle of the closed loop process of endpoint detection is similar to that presented in FIGS. 3 and 4. During etch the RLM is trimmed vertically at a rate $M_V$. The ratio $R_H/M_V$ is determined by the trim process used, but may be close to approximately 1. When RLM layer 32 is eroded away at a time $t_{RLM}$, determined by:

$$M_{HEIGHT}=M_V \times t_{RLM},$$

the resist of photoresist mask structure 34 is laterally trimmed to an extent given by:

$$\text{Resist lateral trim}=R_H \times t_{RLM}.$$

The final CD determines the lateral extent of trim required, $R_H \times t_{TRIM}$, and therefore $t_{TRIM}$. The RLM thickness etched away during this trim time is thus $M_{LOSS}=M_V \times t_{TRIM}$. If appropriate conditions are used, $M_{LOSS}=M_{HEIGHT}$, and $t_{TRIM}$. This would result in the desired final CD lateral dimension 36 of photo resist mask feature 34, and remaining portion of RLM layer 33, as seen in FIG. 6. Since the total thickness of the resist is required to be constant for an anti-reflective node, the thickness of the optically active resist layer 34 could be adjusted to compensate for the RLM layer $M_{HEIGHT}$. Sufficient over-etch times or percentage may be used when desired $t_{TRIM}$ does not correspond exactly to $t_{TRIM}$.

After etch, a remaining portion 33 of RLM tracer layer 32 is left underlying CD photoresist mask feature 34. As in the case of FIG. 4, if residual features 38, or "feet" at the bottom of the former RLM layer 32 occur, these residual features 38 may be removed in an anisotropic plasma breakthrough, which would result in a good perpendicular profile between layer 31 and photoresist mask feature 34, with CD determined by final lateral dimension (width) 36. The plasma breakthrough is typically a CF4/Ar type process run at sufficiently high bias power such that significant ion bombardment occurs. A breakthrough process is typically used to etch inorganic ARCs, such as may be present in layer 31 immediately under the RLM.

Removal of the RLM layer 32 permits the underlying material of layer 31 to interact with the plasma during etch, thus enabling endpoint detection by optical emission spectroscopy. Detection of constituent species of layer 31 by OES during plasma etch permits closed loop control. In addition, for the same reasons taught in the disclosed BARC embodiment, the use of interferometric (broadband or laser source) techniques for endpoint detection is possible. As was the case when using a BARC layer (FIGS. 3 and 4), the use of RLM layer 32 provides the process engineer the advantage of being able to use both OES and optical interferometry for endpoint detection.

Figure 7:
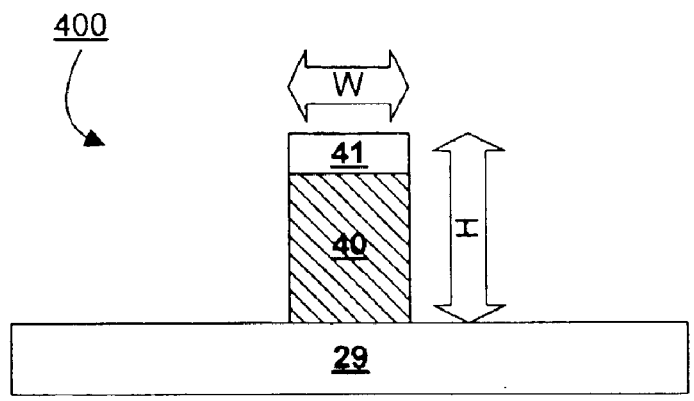
FIG. 7 illustrates the portion of the semiconductor device of FIG. 6 after the process of etching and photoresist stripping according to at least one embodiment of the present invention.

Referring now to FIG. 7, an illustration of a portion 400 with reference to FIG. 6 after the process of etching the layer 31 and layer 30, and photoresist stripping according to an embodiment of the present disclosure, is discussed. The defined feature is a structure such as a gate of final lateral dimension W and final vertical dimension (height) H, and comprises remaining portion 41 of the former layer 31, and remaining portion 40 of the former layer 30 of FIG. 6, overlying substrate 29. Layer 41 may eventually be removed in processing e.g., for salication purposes or the like, during formation of the device. In one embodiment, layer 41 may remain after subsequent processing. Portion 400 is ready for further manufacturing to form a more complete semiconductor device, as shown with reference to FIG. 8.

Figure 8:
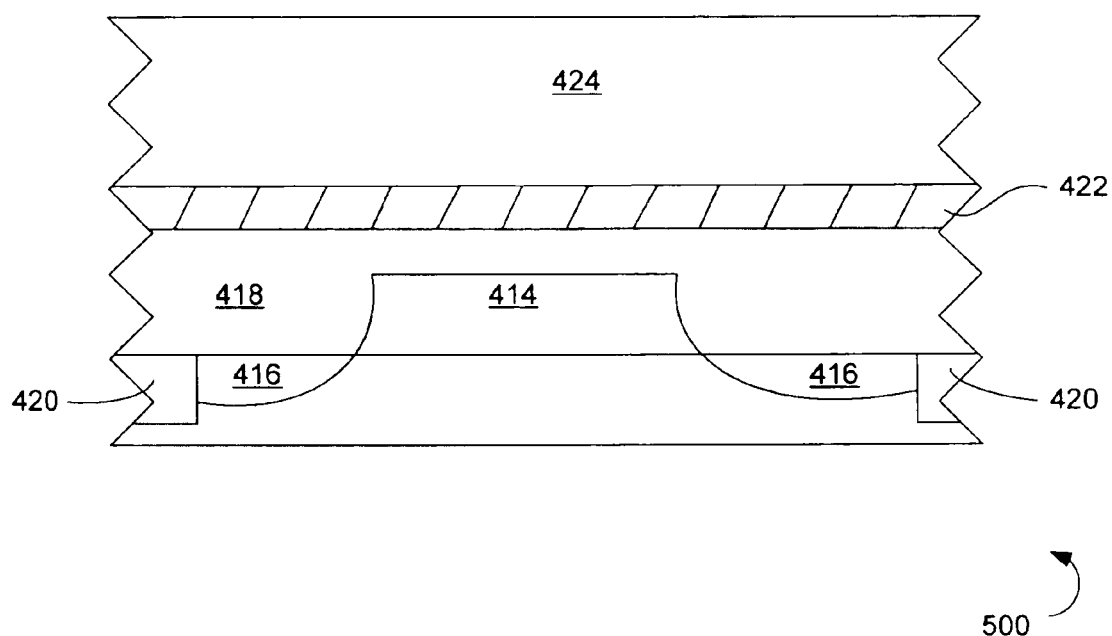
FIG. 8 illustrates a representative semiconductor device formed using the method as provided in at least one embodiment of the present disclosure.

Referring now to FIG. 8, an illustration of a representative semiconductor device formed using the method described herein. Semiconductor device 500 includes a semiconductor substrate 410, gate electrode 414, doped regions 416, dielectric layer 418, isolation regions 420, metal layer 422, and a passivation layer 424. The structure of gate electrode 414 corresponds to the final dimension (width) of remaining portion 40 in FIG. 7. The structure of gate electrode 414 represents an application of the methods as taught herein. The device illustrated in FIG. 8 is presented as an example only, and it should be noted that other elements of the device may include, for example, SOG, SOD, and resist used to pattern the features of a wafer or substrate. It will be appreciated by one skilled in the art that the dry plasma etch processes used to fabricate a semiconductor device as in FIG. 8 may be monitored during their manufacture and the intermediate processes used to fabricate the device, using the techniques described herein.

Figure 9:
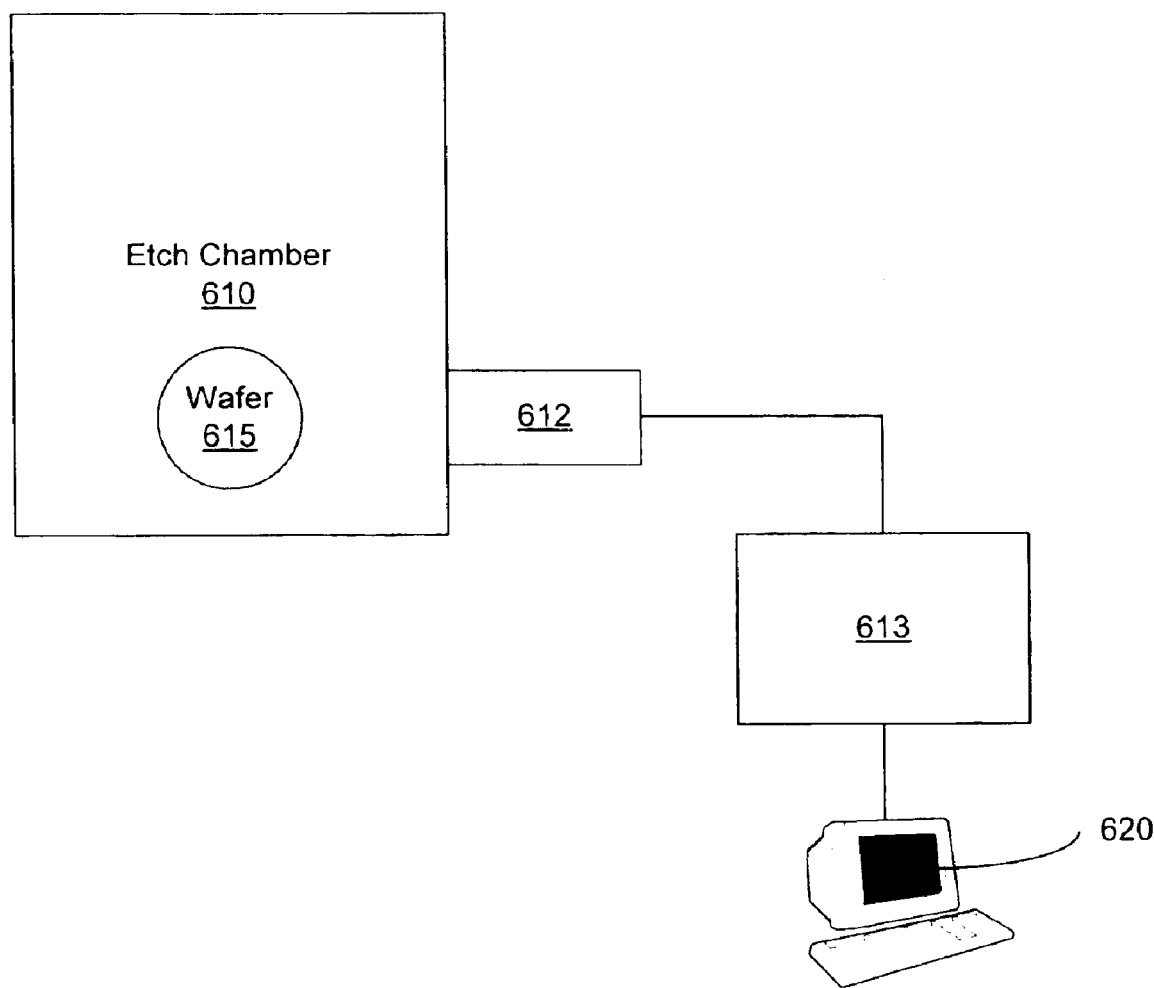
FIG. 9 is a simplified block diagram showing an endpoint monitoring system during a resist trimming process according to at least one embodiment of the present invention.

Referring now to FIG. 9, a simplified block diagram showing an endpoint monitoring system 613 with detector 612 during a resist trimming process on a wafer 615 in a etch chamber 610 according to an embodiment of the present disclosure is presented. Wafer handling and etch system mechanisms are not illustrated in FIG. 9. When practicing the teachings disclosed herein, endpoint monitoring system 613 may be an OES system, an optical interferometer, or a system capable of both OES and interferometric measurements. Wafer 615 is placed into etch chamber 610 for resist trimming as embodied herein. During resist trimming, detector 612 sends signals to monitoring system 613. System 613 displays monitoring results and other parameters, e.g., elapsed time, for a user, e.g., process engineer, on console 620. When resist trim is complete, as determined by monitoring results displayed on console 620, the etch process in chamber 610 can be halted, and wafer 615 transferred to the next manufacturing process area (not shown).

The method and apparatus herein provides for a flexible implementation. Although the invention has been described using certain specific examples, it will be apparent to those skilled in the art that the invention is not limited to these few examples. For example, the disclosure is discussed herein primarily with regard to gate resist trim endpoint detection using a reactive ion etching process, however, the invention can be used to create target critical dimensions for other features such as wires, lines, and the like, that use resist trim plasma etching processes to achieve target critical dimensions. Additionally, various types of plasma etch devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of forming a semiconductor device, comprising:
    forming a tracer layer over a substrate;
    forming a photoresist mask structure having an initial width over the tracer layer, wherein the tracer layer comprises a resist backbone and remains subsequent to formation of the photoresist mask structure, the tracer layer is not optically activated during formation of the photoresist mask structure;
    etching the photoresist mask structure to define a final width of the photoresist mask structure; and
    detecting removal of the tracer layer to terminate etching the photoresist mask structure.

2. The method of claim 1, further comprising forming a dielectric layer prior to forming the tracer layer, wherein the dielectric layer is to be patterned by the photoresist mask structure having the final width.

3. The method of claim 2, wherein the dielectric layer comprises a nitride layer.

4. The method of claim 1, further comprising forming a conductive layer overlying the substrate prior to forming the tracer layer, wherein the conductive layer is to be patterned by the photoresist mask structure having the final width.

5. The method of claim 4, wherein the conductive layer includes poly silicon.

6. The method of claim 1, wherein the tracer layer comprises an organic material.

7. The method of claim 1, further comprising the steps of:
    determining a vertical thickness of the tracer layer based upon a lateral etch rate of the photoresist mask structure.

8. The method of claim 7, wherein determining further comprises determining the vertical thickness of the tracer layer based on the ratio of lateral etch rate of the the photoresist mask structure and vertical etch rate of the tracer layer.

9. The method of claim 8, wherein the ratio is between 1:1 to 1:4 for inductively coupled plasma etch process.

10. The method of claim 8, wherein the ratio between 1:1 to 1:4 for decoupled plasma source etch process.

11. The method of claim 8, wherein the ratio is between 1:2 to 1:8 for reactive ion etch process.

12. The method of claim 8, wherein the ratio is between 1:2 to 1:8 for magnetically enhanced reactive ion etch process.

13. The method of claim 1, wherein the etch process includes reactive ion etch (RIE).

14. The method of claim 1, wherein the etch process includes inductively coupled plasma (ICP) etch.

15. The method of claim 1, wherein the etch process includes magnetically enhanced reactive ion etch (MERIE).

16. The method of claim 1, wherein the etch process includes decoupled plasma source (DPS) etch.

17. The method of claim 1, wherein the step of detecting removal of the tracer layer further comprises:
    monitoring the chemical species present in the etch chamber during etching.

18. The method of claim 17, wherein monitoring includes detection of a chemical species present in the etch chamber using optical emission spectroscopy.

19. The method of claim 1, wherein detecting removal of the tracer layer further comprises:
    monitoring the optical characteristics of an optical source reflected from the etched surfaces during etching.

20. The method of claim 19, wherein the optical characteristics are monitored using optical interferometry.

21. The method of claim 19, wherein the optical source is a broadband emission source.

22. The method of claim 19, wherein the optical source is a laser source.

23. The method of claim 1, wherein the thickness of the tracer layer is in the range of 15 to 30 nm.

24. A method of forming a semiconductor device, comprising:
    determining a vertical thickness of a tracer layer based upon a lateral etch rate of a photoresist mask structure,
    forming the tracer layer over a substrate;
    forming the photoresist mask structure having an initial width over the tracer layer;
    etching the photoresist mask structure to define a final width of the photoresist mask structure; and
    detecting removal of the tracer layer to terminate etching the photoresist mask structure.

25. The method of claim 24, wherein determining further comprises determining the vertical thickness of the tracer layer based on the ratio of lateral etch rate of the photoresist mask structure and vertical etch rate of the tracer layer.

26. The method of claim 25, wherein the ratio is between 1:1 to 1:4 for inductively coupled plasma etch process.

27. The method of claim 25, wherein the ratio between 1:1 to 1:4 for decoupled plasma source etch process.

28. The method of claim 25, wherein the ratio is between 1:2 to 1:8 for reactive ion etch process.

29. The method of claim 25, wherein the ratio is between 1:2 to 1:8 for magnetically enhanced reactive ion etch process.

* * * * *